US009954044B2

(12) United States Patent
Oh et al.

(10) Patent No.: US 9,954,044 B2
(45) Date of Patent: Apr. 24, 2018

(54) DISPLAY APPARATUS

(71) Applicant: Samsung Display Co., Ltd., Yongin (KR)

(72) Inventors: Dong Gun Oh, Osan-si (KR); Seunghyun Park, Seoul (KR); JiEun Lee, Seoul (KR); Cheol-Gon Lee, Seoul (KR); Woongki Jeon, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 161 days.

(21) Appl. No.: 14/693,517

(22) Filed: Apr. 22, 2015

(65) Prior Publication Data

US 2015/0364102 A1   Dec. 17, 2015

(30) Foreign Application Priority Data

Jun. 12, 2014 (KR) .................. 10-2014-0071417

(51) Int. Cl.
*H01L 27/32* (2006.01)
*G02F 1/1368* (2006.01)
(Continued)

(52) U.S. Cl.
CPC ........ *H01L 27/3262* (2013.01); *G02F 1/1368* (2013.01); *G02F 1/136286* (2013.01);
(Continued)

(58) Field of Classification Search
CPC ............. H01L 27/3262; H01L 51/5209; H01L 51/5225; H01L 27/3248; H01L 27/3276;
(Continued)

(56) References Cited

U.S. PATENT DOCUMENTS 7,790,483 B2   9/2010 Miyairi et al.
7,892,897 B2   2/2011 Qiu et al.
(Continued)

FOREIGN PATENT DOCUMENTS

CN   103227147 A  *  7/2013
JP   06-163891        6/1994
(Continued)

OTHER PUBLICATIONS

English translation of CN103227147 (A), Title: TFT-LCD (Thin-film transistor liquid crystal display) array base plate, manufacturing method and LCD, Author: Kong Xiangchun; Cao Zhanfeng; Date of publication: Jul. 31, 2017.*

*Primary Examiner* — Edward Glick
*Assistant Examiner* — Shan Liu
(74) *Attorney, Agent, or Firm* — H.C. Park & Associates, PLC

(57) ABSTRACT

A display apparatus includes a first substrate including a channel-forming area, a second substrate facing the first substrate, a thin-film transistor disposed on the first substrate, a pixel electrode electrically connected to the thin-film transistor, a gate line disposed on the first substrate and electrically connected to the thin-film transistor, a data line electrically connected to the thin-film transistor and divided into at least two portions such that the channel-forming area is disposed between the two portions of the data line, and a connection portion electrically connecting the two portions of the data line to each other, in which the thin-film transistor includes a gate electrode branched from the gate line and overlapping the channel-forming area, a semiconductor pattern overlapping the gate electrode and contacting the two portions of the data line so that the channel-forming area is disposed in the semiconductor pattern, and a drain electrode electrically connected to the pixel electrode and overlapping the semiconductor pattern.

17 Claims, 6 Drawing Sheets

(51) Int. Cl.
    *G02F 1/1362* (2006.01)
    *H01L 51/52* (2006.01)

(52) U.S. Cl.
    CPC ...... *G02F 2201/40* (2013.01); *H01L 27/3248* (2013.01); *H01L 27/3276* (2013.01); *H01L 51/5209* (2013.01); *H01L 51/5225* (2013.01)

(58) Field of Classification Search
    CPC ............... H01L 27/02; H01L 2021/775; H01L 27/1214–27/1296; H01L 27/2436; H01L 29/66037; H01L 29/66068; H01L 29/66227; H01L 29/72; H01L 29/786; H01L 2924/1304; H01L 51/0504; H01L 51/0508; G02F 1/136286; G02F 1/1368; G02F 2201/40; G02F 1/015; G02F 1/136; G02F 1/1362; G02F 1/136277; G02F 2001/13613; G02F 2001/136281; G02F 1/13439; G02F 1/136227; G02F 1/1365; G02F 2001/136218; G02F 2001/136222; G02F 2001/136231; G02F 2001/13625; G02F 2001/1635; G02F 2201/122; G02F 2202/10; G09G 2300/08; G09G 3/3648
    USPC .................................. 349/41–43; 257/72, 59
    See application file for complete search history.

(56) References Cited

U.S. PATENT DOCUMENTS

| | | | |
|---|---|---|---|
| 8,236,628 B2 | 8/2012 | Liu et al. | |
| 8,247,814 B2 | 8/2012 | Maekawa et al. | |
| 8,421,078 B2 | 4/2013 | Chang et al. | |
| 8,436,353 B2 | 5/2013 | Moriguchi et al. | |
| 8,492,765 B2 | 7/2013 | Seong et al. | |
| 2002/0110963 A1* | 8/2002 | Sung | H01L 29/41733 438/158 |
| 2004/0036816 A1* | 2/2004 | Yun | G02F 1/136286 349/43 |
| 2007/0290205 A1 | 12/2007 | Chen et al. | |
| 2007/0298554 A1* | 12/2007 | Long | G02F 1/136227 438/160 |
| 2008/0225208 A1* | 9/2008 | Hong | G02F 1/133528 349/96 |
| 2008/0259263 A1* | 10/2008 | Cho | G02F 1/133707 349/142 |
| 2008/0268581 A1* | 10/2008 | Chin | H01L 27/1214 438/151 |
| 2009/0059110 A1* | 3/2009 | Sasaki | H01L 27/1214 349/39 |
| 2009/0167733 A1* | 7/2009 | Lee | H01L 27/1288 345/205 |
| 2010/0078666 A1* | 4/2010 | Mochiku | H01L 29/78624 257/72 |
| 2010/0091231 A1* | 4/2010 | Nishimura | G02F 1/134363 349/139 |
| 2011/0108849 A1* | 5/2011 | Qiu | H01L 29/78696 257/72 |
| 2011/0221987 A1* | 9/2011 | Kim | G02F 1/133512 349/39 |
| 2012/0001189 A1 | 1/2012 | Matsubara et al. | |
| 2013/0175552 A1* | 7/2013 | Liu | H01L 33/08 257/88 |

FOREIGN PATENT DOCUMENTS

| | | |
|---|---|---|
| JP | 2002-090721 | 3/2002 |
| KR | 10-2006-0068442 | 6/2006 |

\* cited by examiner

DISPLAY APPARATUS

CROSS-REFERENCE TO RELATED APPLICATION

This application claims priority from and the benefit of Korean Patent Application No. 10-2014-0071417, filed on Jun. 12, 2014, which is hereby incorporated by reference for all purposes as if fully set forth herein.

BACKGROUND

Field

Exemplary embodiments of the present invention relate to a display apparatus, and more particularly, to a display apparatus having a thin-film transistor.

Discussion of the Background

A display apparatus may include pixels to display an image. Each of the pixels may include a gate line, a data line, a pixel electrode, and a thin-film transistor, and the thin-film transistor may be electrically connected to the gate line, the data line, and the pixel electrode to switch a data signal applied to the pixel electrode.

The thin-film transistor may include a gate electrode electrically connected to the gate line, a semiconductor pattern overlapping the gate electrode, a source electrode contacting with the semiconductor layer and electrically connected to the data line, and a drain electrode contacting the semiconductor pattern and electrically connected to the pixel electrode.

The gate electrode may cover an entire area of the semiconductor pattern in order to prevent switching characteristics of the thin-film transistor from being deteriorated due to light incident to the semiconductor pattern. However, an increased size of the gate electrode may decrease an aperture ratio of the display apparatus.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display apparatus having an improved aperture ratio.

Exemplary embodiments of the present invention also provide a display apparatus including a data line divided into first and second data lines having a channel-forming area disposed therebetween.

Additional aspects will be set forth in the detailed description which follows, and, in part, will be apparent from the disclosure, or may be learned by practice of the inventive concept.

According to an exemplary embodiment of the present invention, a display apparatus includes, a first substrate including a channel-forming area, a second substrate facing the first substrate, a thin-film transistor disposed on the first substrate, a pixel electrode electrically connected to the thin-film transistor, a gate line disposed on the first substrate and electrically connected to the thin-film transistor, a data line electrically connected to the thin-film transistor and divided into at least two portions such that the channel0forming area is disposed between the two portions of the data line, and a connection portion electrically connecting the two portions of the data line to each other, in which the thin-film transistor includes a gate electrode branched from the gate line and overlapping the channel-forming area, a semiconductor pattern overlapping the gate electrode and contacting the two portions of the data line so that the channel-forming area is disposed in the semiconductor pattern, and a drain electrode electrically connected to the pixel electrode and overlapping the semiconductor pattern.

The data line may include a first data line and a second data line spaced apart from the first data line, in which the first data line is electrically connected to the second data line by the connection portion, and the channel-forming area is disposed between the first and second data lines.

The thin-film transistor may further include a first channel portion disposed between the first data line and the drain electrode, and a second channel portion disposed between the second data line and the drain electrode.

The first channel portion and the second channel portion may be disposed in the channel-forming area.

A first portion of the drain electrode may be disposed between the first data line and the second data line, and a second portion of the drain electrode may be electrically connected to the pixel electrode.

The first data line and the second data line may extend substantially along the same direction.

The display device may further include at least one insulating layer disposed on the data line, in which contact holes that each correspond to the first and the second data lines are formed through the insulating layer, and the connection portion is electrically connected to the first and second data lines through the contact holes.

The gate electrode may have a size greater than a size of the semiconductor pattern to fully overlap with the semiconductor pattern.

An edge of the gate electrode may be spaced apart from an edge of the semiconductor pattern.

The display apparatus may further include a liquid crystal layer disposed between the first substrate and the second substrate and a backlight unit configured to emit light, in which the gate electrode is configured to block the light traveling to the semiconductor pattern.

The pixel electrode may include branch portions and a slit disposed between the branch portions.

The display apparatus may further include a common electrode disposed on the pixel electrode disposed on the first substrate and insulated from the pixel electrode, and a liquid crystal layer disposed between the first substrate and the second substrate.

The connection portion and the common electrode may include the same material.

The display apparatus may further include a liquid crystal layer disposed between the first substrate and the second substrate, and a common electrode disposed on the second substrate and facing the pixel electrode.

The display apparatus may further include an organic light-emitting layer disposed on the pixel electrode, and a common electrode disposed on the organic light-emitting layer.

The connection portion may have a size greater than a size of the semiconductor pattern to fully overlap the semiconductor pattern.

A distance between the edge of the gate electrode and an adjacent edge of the semiconductor pattern may be in a range of 1.5 µm to 5.5 µm.

According to an exemplary embodiment of the present invention, a method of manufacturing a display apparatus may include disposing a data line on a substrate, dividing the data line into at least two portions to form a channel-forming area between the two portions, disposing a thin-film transistor on the substrate, the thin-film transistor including a gate electrode branched from a gate line and overlapping the channel-forming area, a semiconductor pattern overlapping the gate electrode and disposed to be wider than the channel-forming area so that end portions of the divided data lines overlap the semiconductor pattern, and a drain electrode disposed in the channel-forming area to separate the channel-forming area and overlapping the semiconductor pattern, disposing an insulation layer on the thin-film transistor, forming contact holes on the insulation layer to correspond each contact holes to each of the separated channel-forming areas, disposing a transparent conductive layer on the insulation layer and in the contact holes, patterning the transparent conductive layer to form a common electrode and a connection portion, the connection portion electrically connecting the divided data lines through the contact holes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
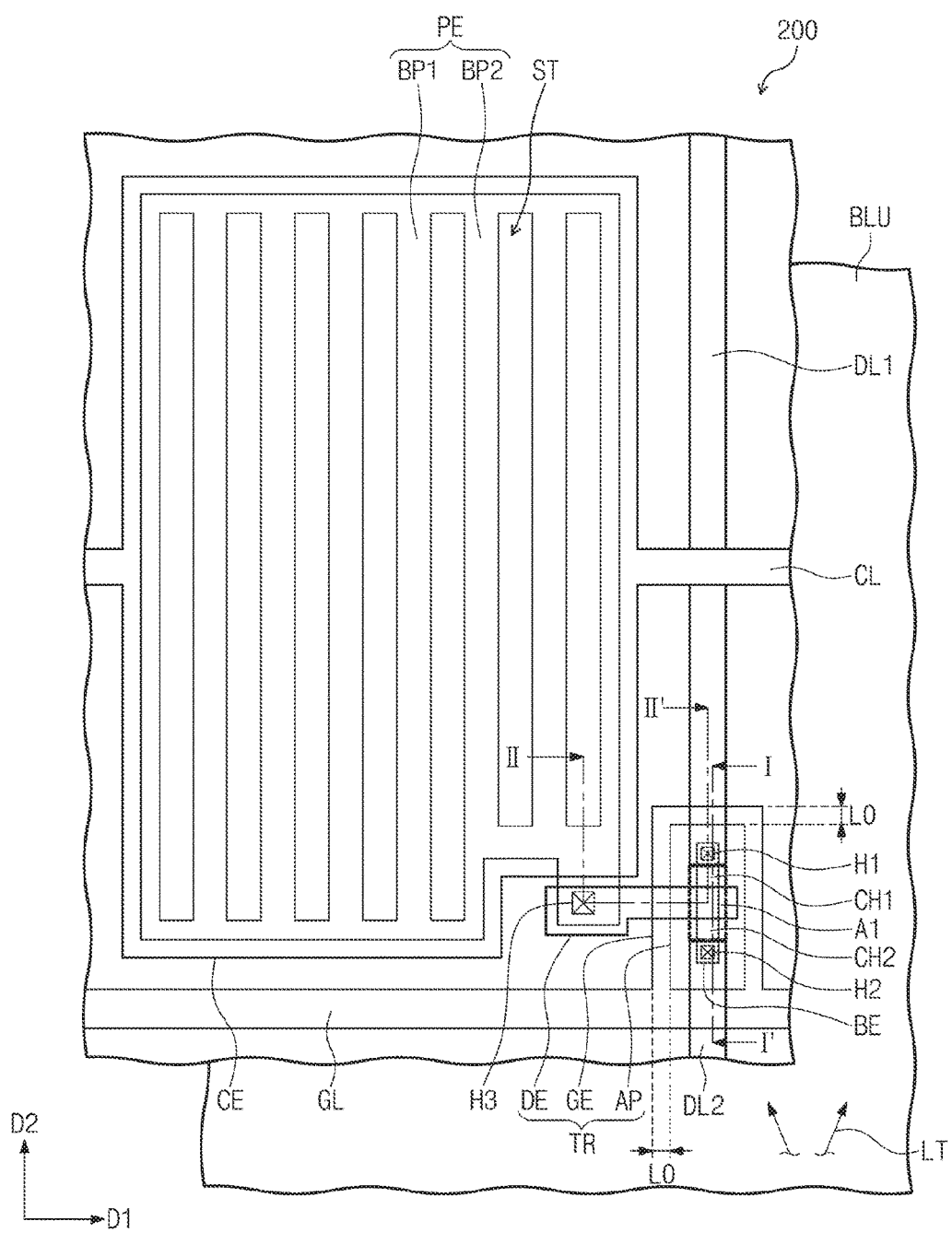
FIG. 1 is a plan view showing a pixel of a display apparatus according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2A:
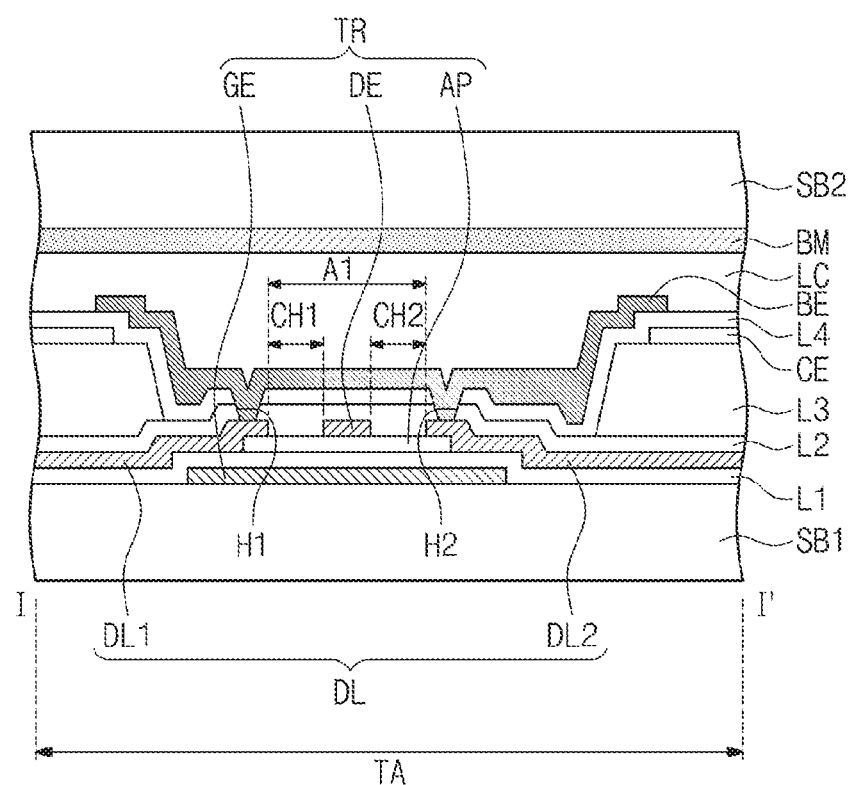
FIG. 2A is a cross-sectional view taken along line I-I' of FIG. 1.
Figure 2B:
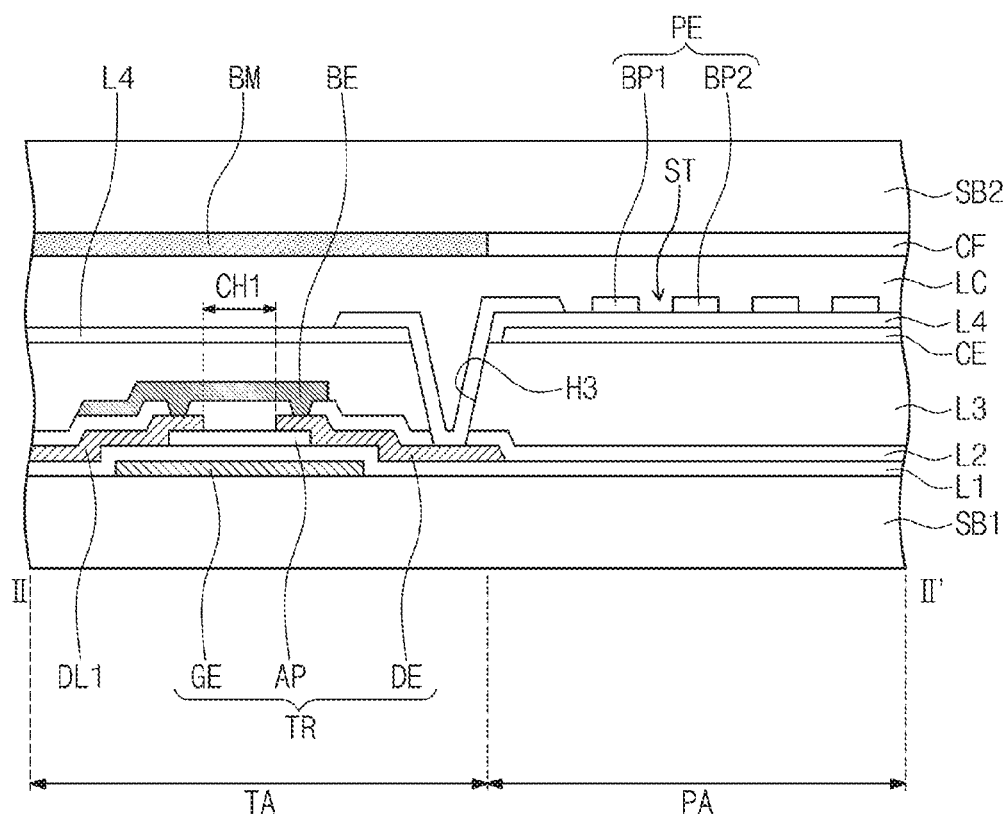
FIG. 2B is a cross-sectional view taken along line II-II' of FIG. 1.

FIG. 1 is a plan view showing a pixel of a display apparatus 200 according to an exemplary embodiment of the present invention, FIG. 2A is a cross-sectional view taken along line I-I' of FIG. 1, and FIG. 2B is a cross-sectional view taken along line II-II' of FIG. 1. The display apparatus 200 includes pixels. For the convenience of description, a single pixel will be described below with reference to FIG. 1.

Referring to FIGS. 1, 2A, and 2B, the display apparatus 200 includes a first substrate SB1, a second substrate SB2, a liquid crystal layer LC, a gate line GL, a data line DL, a connection portion BE, a thin-film transistor TR, a pixel electrode PE, a common electrode CE, a color filter CF, a light blocking layer BM, and a backlight assembly BLU.

In the present exemplary embodiment, the display apparatus 200 may be a liquid crystal display. More particularly, the display apparatus 200 may be the liquid crystal display driven in a plane-to-line switching (PLS) mode. The first substrate SB1 and the second substrate SB2 are disposed to face each other, and the liquid crystal layer LC is interposed between the first substrate SB1 and the second substrate SB2.

The gate line GL is disposed on the first substrate SB1 and electrically connected to the thin-film transistor TR to apply a gate signal to the thin-film transistor TR. The gate line GL substantially extends along a first direction D1.

The data line DL is disposed on the first substrate SB1 and insulated from the gate line GL. A first insulating layer L1 is disposed on the first substrate SB1 to cover the gate line GL and a gate electrode GE branched from the gate line GL. The data line DL is disposed on the first insulating layer L1 to be insulated from the gate line GL.

The data line DL is electrically connected to the thin-film transistor TR to apply a data signal to the thin-film transistor TR. When viewed in a plan view, the data line DL is divided into at least two parts such that a channel-forming area A1 of the first substrate SB1 may be interposed between the two parts of the data line DL. In the present exemplary embodiment, the data line DL is divided into a first data line DL1 and a second data line DL2, and the first and second data lines DL1 and DL2 are spaced apart from each other such that the channel-forming area A1 is disposed between the first and second data lines DL1 and DL2. Each of the first and second data lines DL1 and DL2 substantially extends along a second direction D2.

As shown in FIG. 1, the connection portion BE crosses the channel-forming area A1, and the connection portion BE electrically connects the first and second data lines DL1 and DL2 to each other. More particularly, one part of the connection portion BE is electrically connected to the first data line DL1 through a first contact hole H1 that penetrates a second insulating layer L2, a third insulating layer L3, and a fourth insulating layer L4, and the other part of the connection portion BE is electrically connected to the second data line DL2 through a second contact hole H2 that penetrates the second, third, and fourth insulating layers L2, L3, and L4. Accordingly, the first data line DL1 is electrically connected to the second data line DL2 by the connection portion BE.

In the present exemplary embodiment, the connection portion BE may include a metal, such as an aluminum alloy. Thus, the connection portion BE may cover a semiconductor pattern AP to block external light incident to the semiconductor pattern AP which may prevent a leakage current from occurring in the thin-film transistor TR due to the external light incident to the semiconductor pattern AP, thereby improving uniformity of switching characteristics of the thin-film transistor TR.

The thin-film transistor TR is disposed in a thin-film transistor area TA of the first substrate SB1 and electrically connected to the gate line GL, the data line DL, and the pixel electrode PE. The thin-film transistor TR may be turned on in response to the gate signal to switch the data signal applied to the pixel electrode PE through the data line DL.

The thin-film transistor TR includes the gate electrode GE, the semiconductor pattern AP, and a drain electrode DE. In the present exemplary embodiment, the first and second data lines DL1 and DL2 may be a source electrode of the thin-film transistor TR.

The gate electrode GE may include a metal such as an aluminum alloy. The gate electrode GE is branched from the gate line GL and overlaps the channel-forming area A1.

The semiconductor pattern AP is disposed on the first insulating layer L1 and overlaps the gate electrode GE. In addition, the semiconductor pattern AP covers the channel-forming area A1 and overlaps the first and second data lines DL1 and DL2. More particularly, the semiconductor pattern AP overlaps a portion of the first data line DL1 disposed adjacent to the channel-forming area A1 and a portion of the second data line DL2 disposed adjacent to the channel-forming area A1.

In the present exemplary embodiment, the semiconductor pattern AP may include silicon and/or an oxide semiconductor, such as IGZO, ZnO, $SnO_2$, $IN_2O_3$, $Zn_2SnO_4$, $GeO_3$, and $HfO_2$.

The gate electrode GE may have a size greater than that of the semiconductor pattern AP to overlap the entire area of the semiconductor pattern AP. Thus, referring to FIG. 1, an edge of the gate electrode GE may be spaced apart from an edge of the semiconductor pattern AP disposed adjacent and parallel to the edge of the gate electrode GE by a first length L0.

When the edges of the gate electrode GE are spaced apart from the edges of the semiconductor pattern AP, and the gate electrode GE has a size greater than that of the semiconductor pattern AP to overlap the entire area of the semiconductor pattern AP, a light LT emitted from the backlight assembly BLU and towards the semiconductor pattern AP may be blocked by the gate electrode GE. Accordingly, a leakage current generated by the light LT incident to the semiconductor pattern AP may be prevented from occurring in the thin-film transistor TR, and thus the switching characteristics of the thin-film transistor TR may be uniform.

In the present exemplary embodiment, the first length L0 may be in a range of from about 1.5 micrometers to about 5.5 micrometers so that the gate electrode GE may block the light LT and prevent the leakage current from occurring in the thin-film transistor TR.

The drain electrode DE overlaps the semiconductor pattern AP and is electrically connected to the pixel electrode PE. Referring to FIG. 1, one end of the drain electrode DE overlaps the semiconductor pattern AP and is disposed between the first data line DL1 and the second data line DL2 when viewed in a plan view, and the other end of the drain electrode DE is electrically connected to the pixel electrode PE through a third contact hole H3 that penetrates the second insulating layer L2, the third insulating layer L3, and the fourth insulating layer L4.

According to the present exemplary embodiment, the thin-film transistor TR includes a first channel portion CH1 and a second channel portion CH2. More particularly, the first channel portion CH1 corresponds to an area of the semiconductor pattern AP disposed between the first data line DL1 and the drain electrode DE, and the first channel portion CH1 is disposed between the first data line DL1 and the drain electrode DE. The second channel portion CH2 corresponds to an area of the semiconductor pattern AP disposed between the second data line DL2 and the drain electrode DE, and the second channel portion CH2 is disposed between the second data line DL2 and the drain electrode DE. In addition, the first and second channel portions CH1 and CH2 are disposed in the channel-forming area A1.

Alternately, according to an exemplary embodiment of the present invention, when a thin-film transistor includes a source electrode branched from a data line and a drain electrode spaced apart from the source electrode, a channel portion of the thin-film transistor may be a portion of a semiconductor pattern disposed between the source electrode and the drain electrode. Accordingly, since the channel portion is spaced apart from the data line, an area of the thin-film transistor in the pixel may be increased.

In the exemplary embodiment described above with respect to FIGS. 1, 2A, and 2B, the data line DL is divided into the first and second data lines DL1 and DL2, the channel-forming area A1 is disposed between the first and second data lines DL1 and DL2, and the semiconductor pattern AP overlaps the first and second data lines DL1 and DL2 in the channel-forming area A1. Accordingly, a portion of each of the first and second data lines DL1 and DL2 that overlaps the semiconductor pattern AP may serve as the source electrode. Therefore, the thin-film transistor TR may have a dual channel structure configured to include the first channel portion CH1 and the second channel portion CH2, which are disposed in the channel-forming area A1.

Since the first and second channel portions CH1 and CH2, rather than the data line DL, are arranged in the channel-forming area A1, the area of the thin-film transistor TR overlaps the area of the data line DL, and thus the area of the thin-film transistor TR in the pixel may be decreased. Therefore, an aperture ratio of the pixel may increase. In addition, since the first length L0 may substantially remain the same even though the area of the thin-film transistor TR decreases, the light LT incident to the semiconductor pattern AP may be blocked by using the gate electrode GE.

The common electrode CE is disposed on the third insulating layer L3. The common electrode CE may include a conductive material having a light transmissive property, such as indium tin oxide (ITO) or indium zinc oxide (IZO). The common electrode CE may be electrically connected to a common line CL and receive a common signal applied through the common line CL.

Referring to FIG. 2B, the fourth insulating layer L4 is disposed on the common electrode CE, and the pixel electrode PE is disposed on the fourth insulating layer L4. The pixel electrode PE is disposed in a pixel area PA of the first substrate SB1, and the pixel electrode PE may be insulated from the common electrode CE by the fourth insulating layer L4.

The pixel electrode PE may include branch portions, and a slit ST may be disposed between the branch portions. For instance, the pixel electrode PE includes a first branch portion BP1, a second branch portion BP2, and the slit ST disposed between the first and second branch portions BP1 and BP2. Therefore, a horizontal electric field may be formed between each of the first and second branch portions BP1 and BP2 and the common electrode CE, to control an alignment of liquid crystal molecules of the liquid crystal layer LC, and the display apparatus 200 may be driven in the PLS mode by the electric field.

The second substrate SB2 faces the first substrate SB1, and the light blocking layer BM and the color filter CF are disposed on the second substrate SB2. The light blocking layer BM may block the light LT, and the light blocking layer BM may be disposed at a position corresponding to the position of the thin-film transistor TR. The color filter CF may filter the light LT into a colored light, and the color filter CF may be disposed at a position corresponding to the position of the pixel electrode PE.

Figure 3:
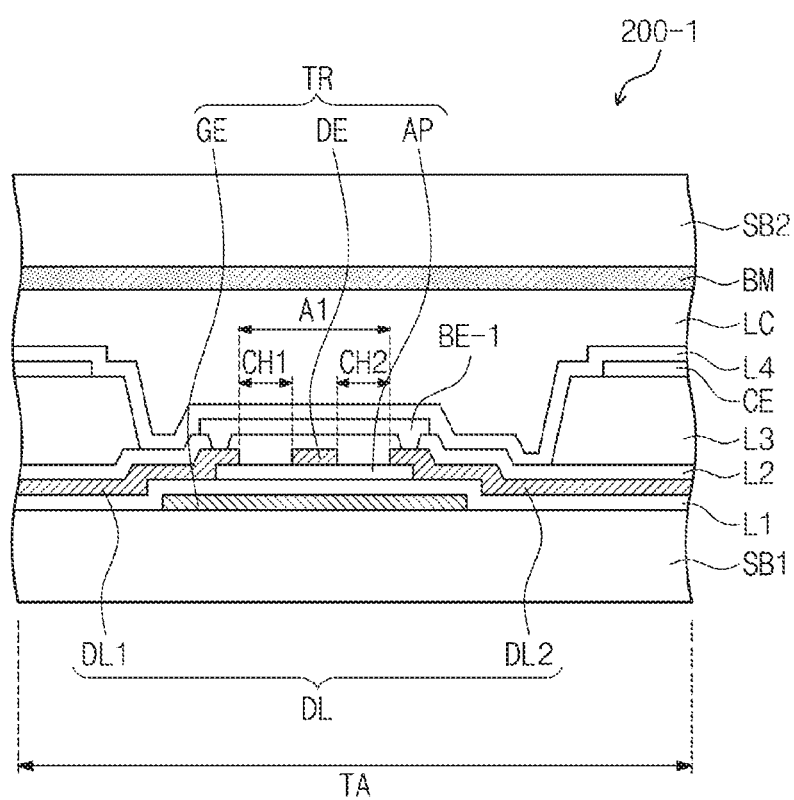
FIG. 3 is a cross-sectional view showing a display apparatus according to an exemplary embodiment of the present invention.

FIG. 3 is a cross-sectional view showing a display apparatus 200-1 according to an exemplary embodiment of the present invention. In FIG. 3, elements that are substantially similar to those illustrated in FIGS. 1, 2A and 2B have the same reference numbers, and thus repeated descriptions of the substantially similar elements and operations illustrated with reference to FIGS. 1, 2A, and 2B will be omitted.

Referring to FIG. 3, a display apparatus 200-1 has substantially similar structure as that of the display apparatus 200 illustrated with reference to FIGS. 1, 2A, and 2B.

The connection portion BE-1 electrically connects a first data line DL1 and a second data line DL2, and the connection portion BE-1 may include the same material as that of a common electrode CE. For instance, each of the common electrode CE and the connection portion BE-1 may include a transparent conductive material, such as indium tin oxide (ITO), indium zinc oxide (IZO).

When the connection portion BE-1 includes the same material as that of the common electrode CE, the connection portion BE-1 may be formed together with the common electrode CE. Thus, no additional process may be required to form the connection portion BE-1, and a manufacturing process of the display apparatus 200-1 may be simplified.

Figure 4:
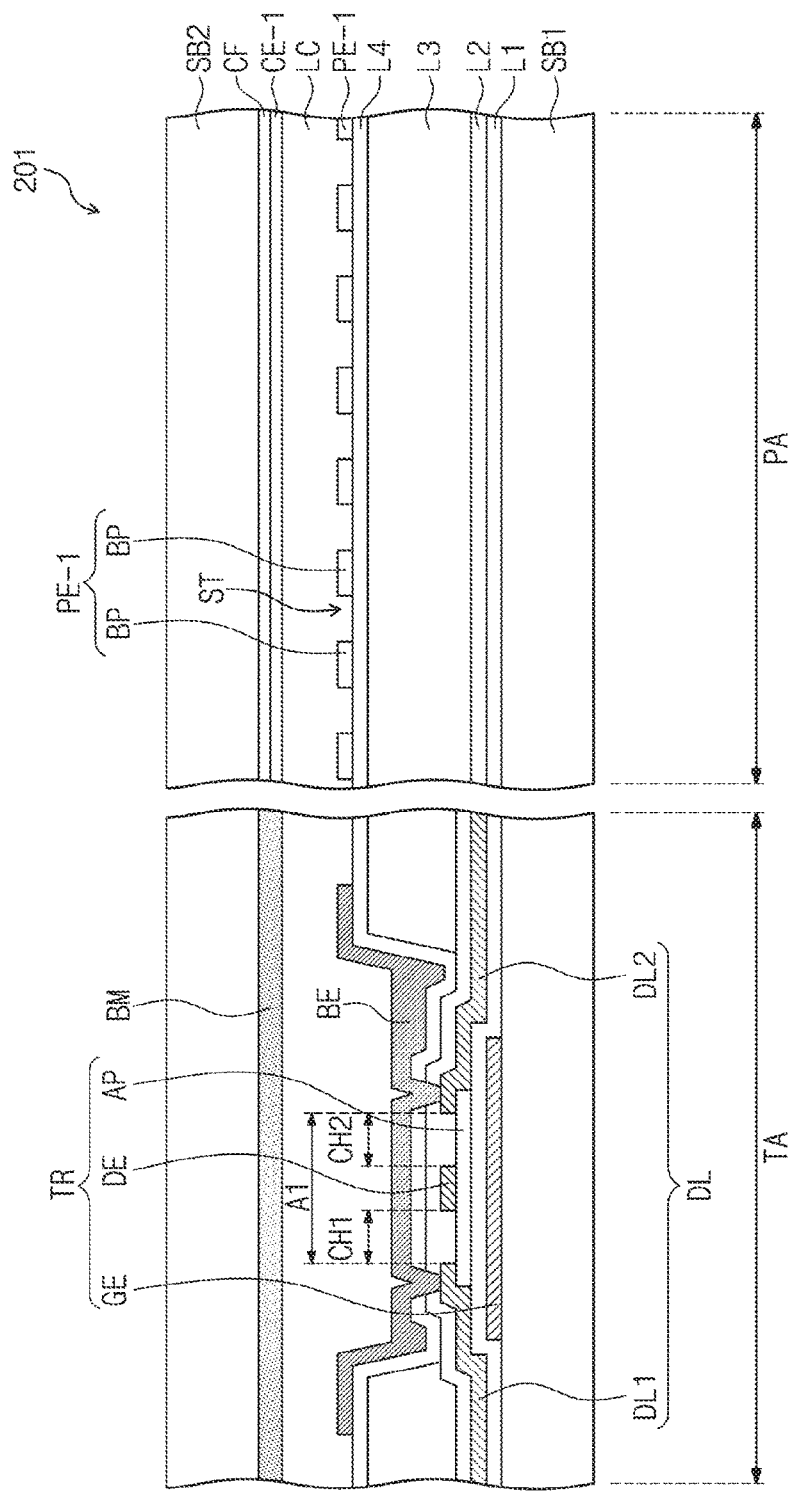
FIG. 4 is a cross-sectional view showing a display apparatus according to an exemplary embodiment of the present invention.

FIG. 4 is a cross-sectional view showing a display apparatus 201 according to an exemplary embodiment of the present invention. In FIG. 4, elements that are substantially similar to those illustrated in FIGS. 1, 2A 2B, and 3 have the same reference numbers, and thus repeated descriptions of the substantially similar elements and operations illustrated with reference to FIGS. 1, 2A, 2B, and 3 will be omitted.

Referring to FIG. 4, a display apparatus 201 includes a first substrate SB1, a second substrate SB2, a liquid crystal layer LC, a thin-film transistor TR, a pixel electrode PE-1, and a common electrode CE-1.

The thin-film transistor TR is disposed in a thin-film transistor area TA of the first substrate SB1, and the thin-film transistor TR may have substantially similar structure as that of the thin-film transistor TR described with reference to FIGS. 1, 2A, and 2B.

The common electrode CE-1 is disposed on the second base substrate SB2 to face the pixel electrode PE-1, and the liquid crystal layer LC is disposed between the common electrode CE-1 and the pixel electrode PE-1. Thus, the common electrode CE-1 may form an electric field together with the pixel electrode PE-1 to control an alignment of liquid crystal molecules of the liquid crystal layer LC.

The pixel electrode PE-1 may be disposed in a pixel area PA of the first substrate SB1. Similar to the pixel electrode PE shown in FIG. 1, which is electrically connected to the drain electrode DE (refer to FIG. 1) through the third contact hole H3 (refer to FIG. 1), the pixel electrode PE-1 according to the present exemplary embodiment may be electrically connected to a drain electrode DE of the thin-film transistor TR. In addition, the pixel electrode PE-1 may include branch portions BP and a slit ST disposed between the branch portions BP, and thus the display apparatus 201 may be driven in a patterned vertical alignment (PVA) mode.

According to an exemplary embodiment of the present invention, a slit may be formed in the common electrode CE-1, rather than in the pixel electrode PE-1. The pixel electrode PE-1 and the common electrode CE-1 may be disposed on a fourth insulating layer L4 while being spaced apart from each other.

Figure 5:
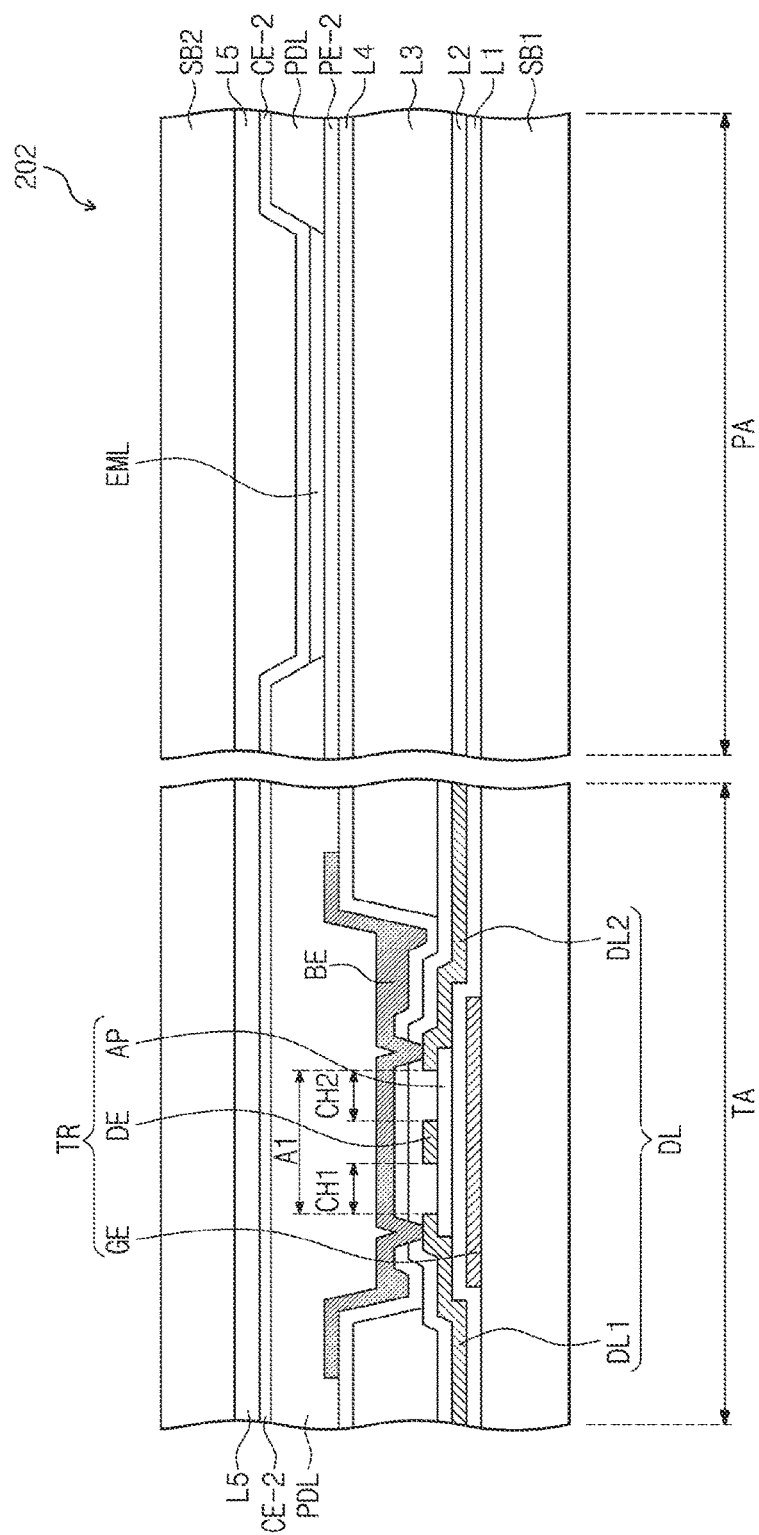
FIG. 5 is a cross-sectional view showing a display apparatus according to an exemplary embodiment of the present invention.

FIG. 5 is a cross-sectional view showing a display apparatus 202 according to an exemplary embodiment of the present invention. In FIG. 5, elements that are substantially similar to those illustrated in FIGS. 1 to 4 have the same reference numbers, and thus repeated descriptions of the substantially similar elements and operations illustrated with reference to FIGS. 1 to 4 will be omitted.

Referring to FIG. 5, a display apparatus 202 may be an organic electroluminescent display device. The display apparatus 202 includes a first substrate SB1, a second substrate SB2, a thin-film transistor TR, a pixel electrode PE-2, an organic light emitting layer EML, a pixel definition layer PDL, a fifth insulating layer L5, and a common electrode CE-2.

The thin-film transistor TR is disposed in a thin-film transistor area TA of the first substrate SB1, and the thin-film transistor TR may have substantially similar structure as that of the thin-film transistor TR illustrated with reference to FIGS. 1, 2A, and 2B.

The pixel electrode PE-2 is disposed in a pixel area PA of the first substrate SB1. Similar to the pixel electrode PE shown in FIG. 1, which is electrically connected to the drain electrode DE (refer to FIG. 1) through the third contact hole H3 (refer to FIG. 1), the pixel electrode PE-2 according to the present exemplary embodiment may be electrically connected to a drain electrode DE of the thin-film transistor TR.

The pixel definition layer PDL covers the thin-film transistor TR. In addition, the pixel definition layer PDL has an opening formed therethrough to correspond to the pixel area PA.

The organic light emitting layer EML is provided in the opening of the pixel definition layer PDL and disposed on the pixel electrode PE-2. In the present exemplary embodiment, the pixel electrode PE-2 may serve as an anode, and a hole injection layer (not shown) and a hole transport layer (not shown) may be sequentially stacked between the pixel electrode PE-2 and the organic light emitting layer EML.

The common electrode CE-2 is disposed on the organic light emitting layer EML. Thus, the pixel area PA includes a pixel including the pixel electrode PE-2, the organic light emitting layer EML, and the common electrode CE-2. In the present exemplary embodiment, the common electrode CE-2 may serve as a cathode, and an electron transport layer (not shown) and an electron injection layer (not shown) may be sequentially stacked between the organic light emitting layer EML and the common electrode CE-2.

The fifth insulating layer L5 covers the common electrode CE-2, and the second substrate SB2 covers the fifth insulating layer L5 to prevent gas and moisture from entering the organic light emitting layer EML in cooperation with the fifth insulating layer L5. The second substrate SB2 may be a sealing substrate, and thus the second substrate SB2 may include an inorganic layer and an organic layer stacked on the inorganic layer.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display apparatus, comprising:
   a first substrate comprising a channel-forming area;
   a second substrate facing the first substrate;
   a thin-film transistor disposed on the first substrate;
   a pixel electrode electrically connected to the thin-film transistor;
   a gate line disposed on the first substrate and electrically connected to the thin-film transistor;
   a data line electrically connected to the thin-film transistor and divided into at least two portions such that the channel-forming area is disposed between the two portions of the data line; and
   a connection portion electrically connecting the two portions of the data line to each other,
   wherein the thin-film transistor comprises:
   a gate electrode branched from the gate line and overlapping the channel-forming area;
   a semiconductor pattern overlapping the gate electrode and contacting the two portions of the data line so that the channel-forming area is disposed in the semiconductor pattern, wherein the channel-forming area extends in a direction in which the connection portion extends; and
   a drain electrode electrically connected to the pixel electrode and overlapping the semiconductor pattern and the connection portion, and
   wherein the data line comprises a first data line and a second data line spaced apart from the first data line; the first data line is electrically connected to the second data line by the connection portion, the channel-forming area is disposed between the first and second data lines, and the gate electrode overlaps each of the drain electrode, the first data line and the second data line.

2. The display apparatus of claim 1, wherein the thin-film transistor further comprises:
   a first channel portion disposed between the first data line and the drain electrode; and
   a second channel portion disposed between the second data line and the drain electrode, and
   the first channel portion and the second channel portion apart from each other in the direction in which the connection portion extend, and
   the gate electrode overlaps the first channel portion and the second channel portion.

3. The display apparatus of claim 2, wherein the first channel portion and the second channel portion are disposed in the channel-forming area.

4. The display apparatus of claim 1, wherein:
   a first portion of the drain electrode is disposed between the first data line and the second data line; and a second portion of the drain electrode is electrically connected to the pixel electrode.

5. The display apparatus of claim 1, wherein the first data line and the second data line extend substantially along the same direction.

6. The display apparatus of claim 1, further comprising at least one insulating layer disposed on the data line, wherein:
contact holes that each correspond to the first and second data lines are formed through the insulating layer; and
the connection portion is electrically connected to the first and second data lines through the contact holes.

7. The display apparatus of claim 1, wherein the gate electrode has a size greater than a size of the semiconductor pattern to fully overlap the semiconductor pattern.

8. The display apparatus of claim 7, wherein an edge of the gate electrode is spaced apart from an edge of the semiconductor pattern.

9. The display apparatus of claim 8, wherein a distance between the edge of the gate electrode and an adjacent edge of the semiconductor pattern is in a range of 1.5 µm to 5.5 µm.

10. The display apparatus of claim 7, further comprising:
a liquid crystal layer disposed between the first substrate and the second substrate; and
a backlight unit configured to emit light,
wherein the gate electrode is configured to block the light traveling to the semiconductor pattern.

11. The display apparatus of claim 1, wherein the pixel electrode comprises branch portions and a slit disposed between the branch portions.

12. The display apparatus of claim 11, further comprising:
a common electrode disposed on the pixel electrode disposed on the first substrate and insulated from the pixel electrode; and
a liquid crystal layer disposed between the first substrate and the second substrate.

13. The display apparatus of claim 12, wherein the connection portion and the common electrode comprise the same material.

14. The display apparatus of claim 1, wherein the connection portion comprises a metal.

15. The display apparatus of claim 1, further comprising:
a liquid crystal layer disposed between the first substrate and the second substrate; and
a common electrode disposed on the second substrate and facing the pixel electrode.

16. The display apparatus of claim 1, further comprising: an organic light-emitting layer disposed on the pixel electrode; and a common electrode disposed on the organic light-emitting layer.

17. The display apparatus of claim 1, wherein the connection portion has a size greater than a size of the semiconductor pattern to fully overlap the semiconductor pattern.

* * * * *